(12) United States Patent
Isa et al.

(10) Patent No.: US 7,696,625 B2
(45) Date of Patent: Apr. 13, 2010

(54) SEMICONDUCTOR DEVICE AND METHOD FOR MANUFACTURING THE SAME

(75) Inventors: Toshiyuki Isa, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 945 days.

(21) Appl. No.: 11/283,876

(22) Filed: Nov. 22, 2005

(65) Prior Publication Data
US 2006/0113671 A1 Jun. 1, 2006

(30) Foreign Application Priority Data
Nov. 30, 2004 (JP) ............................. 2004-347898

(51) Int. Cl.
*H01L 23/48* (2006.01)
*H01L 23/52* (2006.01)
*H01L 29/40* (2006.01)

(52) U.S. Cl. ............ 257/758; 257/E23.06; 257/E23.068

(58) Field of Classification Search ................. 438/724; 257/347, 758, E21.579, 211, E23.06, E23.068
See application file for complete search history.

(56) References Cited

U.S. PATENT DOCUMENTS

| | | | |
|---|---|---|---|
| 5,126,231 A | 6/1992 | Levy | |
| 5,384,276 A | 1/1995 | Ogawa et al. | |
| 5,656,834 A | 8/1997 | Grzyb et al. | |
| 5,946,559 A | 8/1999 | Leedy | |
| 6,043,145 A | 3/2000 | Suzuki et al. | |
| 6,051,508 A * | 4/2000 | Takase et al. | ................ 438/724 |
| 6,309,957 B1 | 10/2001 | Tu et al. | |
| 6,376,353 B1 | 4/2002 | Zhou et al. | |
| 6,383,920 B1 | 5/2002 | Wang et al. | |
| 6,399,486 B1 | 6/2002 | Chen et al. | |
| 6,429,118 B1 | 8/2002 | Chen et al. | |

(Continued)

FOREIGN PATENT DOCUMENTS

CN 1138217 A 12/1996

(Continued)

OTHER PUBLICATIONS

Nikkei Microdevices, Nov. 1, 2004, No. 233, pp. 58-65, along with Full English translation.

(Continued)

*Primary Examiner*—Leonardo Andújar
*Assistant Examiner*—Monica D Harrison
(74) *Attorney, Agent, or Firm*—Nixon Peabody LLP; Jeffrey L. Costellia

(57) ABSTRACT

In a manufacturing process of a semiconductor device, electroplating and CMP have had a problem of increase in manufacturing costs for forming a wiring. Correspondingly, an opening is formed in a porous insulating film after a mask is formed thereover, and a conductive material containing Ag is dropped into the opening. Further, a first conductive layer is formed by baking the conductive material dropped into the opening by selective irradiation with laser light. Subsequently, a metal film is formed over the entire surface by sputtering, and the mask is removed thereafter to have only the metal film remain over the first conductive layer, thereby forming an embedded wiring layer formed with a stack of the first conductive layer containing Ag and the second conductive layer (metal film).

19 Claims, 8 Drawing Sheets

U.S. PATENT DOCUMENTS

| | | |
|---|---|---|
| 6,492,708 B2 | 12/2002 | Acosta et al. |
| 6,514,855 B1 | 2/2003 | Suzuki et al. |
| 6,693,038 B1 | 2/2004 | Shen |
| 6,720,230 B2 | 4/2004 | Acosta et al. |
| 6,726,535 B2 * | 4/2004 | Shih et al. ............... 451/37 |
| 6,727,515 B2 * | 4/2004 | Nakata et al. ............ 257/40 |
| 6,734,029 B2 | 5/2004 | Furusawa |
| 6,753,249 B1 | 6/2004 | Chen et al. |
| 6,897,433 B2 | 5/2005 | Itoh et al. |
| 6,946,381 B2 | 9/2005 | Hwang |
| 7,045,861 B2 * | 5/2006 | Takayama et al. ......... 257/347 |
| 7,164,191 B2 | 1/2007 | Morisaki et al. |
| 7,199,044 B2 * | 4/2007 | Ohtsuka et al. .......... 438/627 |
| 7,356,921 B2 | 4/2008 | Furusawa et al. |
| 7,404,990 B2 | 7/2008 | Lukas et al. |
| 2002/0130386 A1 | 9/2002 | Acosta et al. |
| 2003/0174552 A1 | 9/2003 | Itoh et al. |
| 2004/0002208 A1 | 1/2004 | Takigawa et al. |
| 2004/0096593 A1 | 5/2004 | Lukas et al. |
| 2004/0135269 A1 | 7/2004 | Otsuki |
| 2004/0137241 A1 | 7/2004 | Lin et al. |
| 2005/0082626 A1 | 4/2005 | Leedy |
| 2005/0127035 A1 | 6/2005 | Ling |
| 2005/0191847 A1 | 9/2005 | Misawa et al. |
| 2006/0115982 A1 | 6/2006 | Morisue et al. |
| 2006/0115983 A1 | 6/2006 | Fujii et al. |
| 2006/0116000 A1 | 6/2006 | Yamamoto |
| 2006/0165875 A1 | 7/2006 | Otsuki |

FOREIGN PATENT DOCUMENTS

| | | |
|---|---|---|
| CN | 1429405 A | 7/2003 |
| CN | 1479567 A | 3/2004 |
| EP | 1282161 A1 | 2/2003 |
| JP | 09-306988 | 11/1997 |
| JP | 2001-179167 | 7/2001 |
| JP | 2001-332092 | 11/2001 |
| JP | 2002-164635 | 6/2002 |

OTHER PUBLICATIONS

"Introduction of porous low-k has begun a full-scale It has started with a spin coating method," Nikkei Microdevices, Nov. 1, 2004, No. 233, pp. 58-65, along with Full English translation.

Chinese Office Action (Chinese Patent Application No. 200510129046.4X) Dated May 30, 2008 with English translation.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device having an integrated circuit and a method for manufacturing the same. The invention particularly relates to an electronic device having, as a component, a semiconductor element including an embedded wiring.

Note that a semiconductor device in this specification means general devices and apparatuses which can function with the use of semiconductor characteristics; for example, electro-optical devices, semiconductor circuits, and electronic devices are all included in a semiconductor device.

2. Description of the Related Art

In recent years, in the case of forming a multilevel interconnection which includes a plurality of wiring layer in a semiconductor element, irregularities are more significant in upper layers, and the wirings are difficult to be processed. Correspondingly, a wiring material is generally embedded in a wiring opening such as a wiring trench or a hole formed in an insulating film by a wiring formation technology called a damascene process.

A damascene process is a method in which a trench is first formed in an insulating film, the entire surface is covered with a metal material (filling the trench), and the entire surface is polished by CMP (chemical mechanical polishing) or the like to form a metal wiring. The method further including a step of providing a hole below a metal wiring for contact with a metal wiring or a semiconductor region in a lower layer is called a dual damascene process. The dual damascene process includes a step in which, after forming a hole for a connection with a lower layer wiring and a wiring trench are formed, a wiring material is deposited, and the wiring material except the wiring part is removed by CMP.

For a metal wiring using a dual damascene process, copper (Cu) by electroplating is commonly used. In the electroplating, a plating solution or the electric field to be applied is required to be controlled intricately so that copper (Cu) is completely embedded in the connection hole. Further, it is difficult to process copper (Cu) by an etching process using an etchant or an etching gas; therefore, a special CMP method is required for polishing for copper (Cu) processing.

Electroplating and CMP have had a problem of increase in manufacturing costs for forming a wiring.

Further, in order to achieve a high performance semiconductor device that is capable of high speed operation, a structure in which an insulating film having lower dielectric constant is used for the insulating film to be provided with a wiring opening in addition to using a wiring material having lower resistivity than copper (Cu) is further required in the future.

Hence, the present inventors consider using silver nanoparticles for obtaining a wiring formed of silver or an alloy mainly containing silver each having lower resistivity than copper. However, the present inventors found problems that, since a silicon dioxide film or a silicon nitride film which is used for a conventional interlayer insulating film is dense, the area in contact with silver nanoparticles is small and the adhesion is weak.

Further, as for a silicon dioxide film ($\in$=4.1 to 3.7) which has been used for a conventional interlayer insulating film, the dielectric constant is high; thus, an insulating film having further lower dielectric constant is required.

BRIEF SUMMARY OF THE INVENTION

The present invention has been made in view of the above problems, and it is an object of the present invention to provide a method for manufacturing a semiconductor device including a wiring having lower resistivity and an interlayer insulating film having lower dielectric constant which are necessary for much faster semiconductor devices.

A feature of a method for manufacturing a semiconductor device according to the present invention is to form a silver wiring which connects to a wiring formed below an interlayer insulating film through a connection hole in the interlayer insulating film. The method includes the steps of forming an interlayer insulating film over a lower layer wiring and forming a connection hole connecting to the lower layer wiring and a wiring trench in the interlayer insulating film, and further includes at least a patterning step for forming the wiring trench for forming an upper layer wiring in the interlayer insulating film, a step of dropping a liquid conductive material (typically, Ag) to the connection hole and the wiring trench by a droplet discharge method (typically, an ink-jet method), a baking step in which the dropped conductive material is selectively baked to form a first conductive layer, and a step of forming a second conductive layer covering the surface of the first conductive layer to prevent the conductive material of the first conductive layer from diffusion thereby forming an upper layer wiring formed with a stack of the first wiring and the second wiring.

Accordingly, a structure 1 of the invention concerning a method for manufacturing a semiconductor device which is disclosed in this specification is a method for manufacturing a semiconductor device having a wiring layer. The method includes the steps of forming an insulating film; forming an opening (a connection hole and a wiring trench) in the insulating film by selective etching; dropping a droplet containing a conductive material into the opening by a droplet discharge method; heating the conductive material in the opening by selective irradiation with laser light, thereby forming a first conductive layer embedded in the opening of the insulating film; and forming a second conductive layer covering a top surface of the first conductive layer.

In the above structure 1, the second conductive layer serving as a barrier film for preventing the diffusion of the conductive materials of the first conductive layer is a metal layer containing one or more selected from the group consisting of W, Mo, Ti, Cr, and Ta, which is formed by sputtering.

Further, a barrier film is preferably formed to prevent diffusion of a conductive material (Ag) before dropping a droplet containing a conductive film into an opening (a connection hole and a wiring trench) by a droplet discharge method. A structure 2 of the invention concerning a method for manufacturing a semiconductor device is a method for manufacturing a semiconductor device having an integrated circuit and a wiring, and includes the steps of: forming an insulating film; forming a mask over the insulating film; forming an opening (a connection hole and a wiring trench) in the insulating film by selective etching; forming a first conductive layer over the mask and in the opening; dropping a droplet containing a conductive material into the opening by a droplet discharge method; heating the conductive material in the opening by selective irradiation with laser light, thereby forming a second conductive layer embedded in the opening of the insulating film; forming a third conductive layer over the mask and the second conductive layer; and removing the first conductive layer and the third conductive layer which are formed over the mask concurrently with the removal of the mask, such that part of the third conductive layer formed remains in the opening.

In the above structure 2, in order to obtain an insulating film having low dielectric constant, a porous insulating film is preferably used for the insulating film. In this specification, a porous insulating film refers to an insulating film having minute cavities, preferably, a film selected from an inorganic insulating film, an organic insulating film, and an organic-inorganic hybrid insulating film which has the cavity rate in the range of from 20% to less than 90%. If the cavity rate is lower than the range, the dielectric constant cannot be sufficiently reduced. Further, the cavity range higher than the range of cavity rate causes lack of mechanical strength of the film.

Further, the present invention is not limited to the one in which a conductive film is baked by selective irradiation with laser light. A structure 3 of the invention concerning a method for manufacturing a semiconductor device is a method for manufacturing a semiconductor device having an integrated circuit and a wiring, and includes the steps of: forming an insulating film; forming an opening (a connection hole and a wiring trench) in the insulating film by selective etching; forming a first conductive film; dropping a droplet containing a conductive material into the opening or to the periphery thereof by a droplet discharge method, thereby forming a conductive film by baking; selectively etching the conductive film thereby forming a second conductive layer; forming a third conductive film over the second conductive layer; and etching the first conductive film and the third conductive film using one mask thereby forming a first conductive layer and a third conductive layer, wherein a surface of the first conductive film is subjected to a surface treatment for reducing the contact angle of the droplet to be dropped before dropping the droplet.

The region subjected to the surface treatment is a region having a small contact angle to be a region with high wettability (hereinafter referred to as a high wettability region). When the contact angle is large, a liquid composition having fluidity does not spread and is repelled by the surface of the area; therefore, the surface is not wetted. Meanwhile, when the contact angle is small, the composition having fluidity spreads over the surface, and the surface is well wetted. In the present invention, the contact angle of the high wettability region is preferably 10° or less. As the surface treatment, for example, a treatment in which the wettability is selectively increased by light may be conducted. Specifically, a material having low wettability is formed in the vicinity of the pattern formation region, and light capable of decomposing the material having low wettability is applied to decompose and remove the substance having low wettability in a treatment region. Thus, the wettability of the region to be treated is increased to form a high-wettability region.

By conducting the surface treatment as in the structure 3, when the droplet containing the conductive material is dropped, the connection hole and the wiring trench can be filled so that the droplets wet and spread. By dropping a droplet containing the conductive material so as to wet and spread, the tact time of an coating process can be reduced compared with a method in which coating is conducted along the connection hole and the wiring trench by an ink-jet method without surface treatment. Further, the consumption of material can be reduced compared with a method in which coating is conducted by spin-on-coating.

A semiconductor device obtained by the manufacturing method of the structure 2 is also included in the present invention. A structure 4 of the semiconductor device is a semiconductor device comprising: an integrated circuit; a wiring layer; and a porous insulating film, wherein the wiring layer has a stack of: a first conductive layer in contact with a bottom and an inner wall of a wiring trench or a contact hole (also referred to as a connection hole) which is formed in the porous insulating film, a second conductive layer on the first conductive layer, and a third conductive layer in contact with the first conductive layer and a top surface of the second conductive layer, the second conductive layer is surrounded by the first conductive layer and the third conductive layer, and a first surface including a top surface of the porous insulating film and a second surface including a top surface of the third insulating layer have a stepped portion therebetween.

In the structure 4, the porous insulating film is formed of a material containing silicon oxide.

The present invention is not particularly limited to the porous insulating film. A structure 5 is a semiconductor device including: an integrated circuit; a wiring layer; and an insulating film, wherein the wiring layer has a stack of: a first conductive layer in contact with a bottom and an inner wall of a wiring trench or a contact hole which is formed in the insulating film, a second conductive layer on the first conductive layer, and a third conductive layer in contact with the first conductive layer and a top surface of the second conductive layer, the second conductive layer is surrounded by the first conductive layer and the third conductive layer, and a first surface including a top surface of the insulating film and a second surface including a top surface of the third insulating layer have a stepped portion therebetween.

In the structures 2 to 5, the integrated circuit includes at least one of a controller, a CPU, and a memory. Further, the integrated circuit may have an antenna.

Further, in the structures 2 to 5, the first conductive layer and the third conductive layer are metal layers each containing one or more selected from the group consisting of W, Mo, Ti, Cr, and Ta, which are formed by sputtering. In addition, the first conductive layer and the third conductive layer may be formed of the same materials or different materials.

Further, in the structures 2 to 5, the second conductive layer is formed of a material containing silver. In a method for forming a pattern of a conductive layer or the like by a droplet discharge method, a pattern formation material which is processed into particles is discharged, and fused or welded and joined by baking to solidify the pattern formation material. A pattern which is formed by sputtering or the like often has a columnar structure; meanwhile, the pattern formed by the method according to the present invention mostly has a polycrystalline structure containing many grain boundaries.

Further, in the structures 2 to 5, the second conductive layer is formed of a material containing resin. The resin is a material such as a binder included in a droplet containing a conductive material. The resin, a solvent, and silver nanoparticles are mixed so as to be discharged by an ink-jet method.

By selectively forming a wiring of the present invention, the number of the processes can be reduced compared with a conventional method. Further, a conductive film can be completely embedded in an interlayer insulating film having high aspect ratio by using a liquid conductive material.

Further, in the present invention, by using a porous insulating film for an interlayer insulating film, the dielectric constant of the interlayer insulating film can be reduced;

besides, the adhesion between the interlayer insulating film and a paste containing Ag can be improved.

DETAILED DESCRIPTION OF THE INVENTION

Embodiment modes of the present invention will be explained below.

Embodiment Mode 1

In this embodiment mode, modes of forming a silver wiring embedded in an interlayer insulating film in accordance with the present invention will be described with reference to FIGS. 1A to 1E and FIGS. 2A to 2C. Here, semiconductor elements and integrated circuits are not shown for simplicity, and only a connection portion of an embedded silver wiring and a lower layer wiring is shown.

Figure 1A:
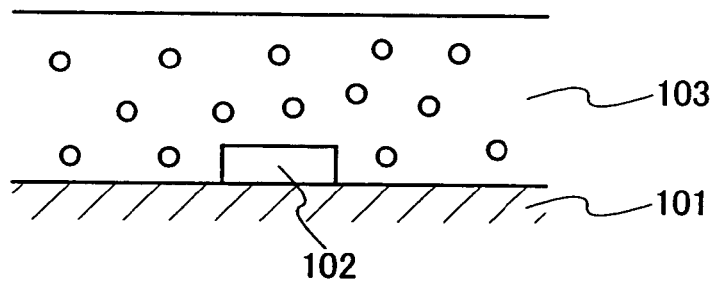
FIGS. 1A to 1E are figures showing a manufacturing process of the present invention (Embodiment Mode 1).

First, a first layer wiring (a lower layer wiring) 102 is formed over an insulating film 101 provided over a semiconductor substrate in which elements such as a transistor (not shown) are formed. An interlayer insulating film 103 is formed to cover the wiring 102 (FIG. 1A).

The semiconductor substrate is a single crystal silicon substrate or a chemical compound semiconductor substrate. An n-type or p-type single crystal silicon substrate, a GaAs substrate, an InP substrate, a GaN substrate, a SiC substrate, a sapphire substrate, or a ZnSe substrate is typically used. Further, an SOI (silicon on insulator) in which an insulating layer and a single crystalline semiconductor layer are stacked may be used. As the SOI substrate, for example, a SIMOX (separation by implanted oxygen) substrate may be used. The SIMOX substrate is a substrate which is manufactured by embedding oxygen molecules into a portion slightly deeper than the surface of the single crystal semiconductor layer, and oxidizing it with a high temperature, thereby forming an insulating layer and a single crystal semiconductor layer on the insulating layer. The substrate is a stack of a first single crystal semiconductor layer, an insulating layer, and a second single crystal semiconductor layer.

A material having low dielectric constant is selected for the interlayer insulating film 103 in order to prevent signal delay due to capacitance. The aim can be achieved by using a porous insulating film for the interlayer insulating film 103. In this embodiment mode, a porous insulating film is used for the interlayer insulating film 103, thereby achieving lower dielectric constant and improvement in adhesion with a wiring material to be formed later. The reason why the adhesion between a wiring material and the porous interlayer insulating film having low dielectric constant is improved will be described later.

Figure 1B:
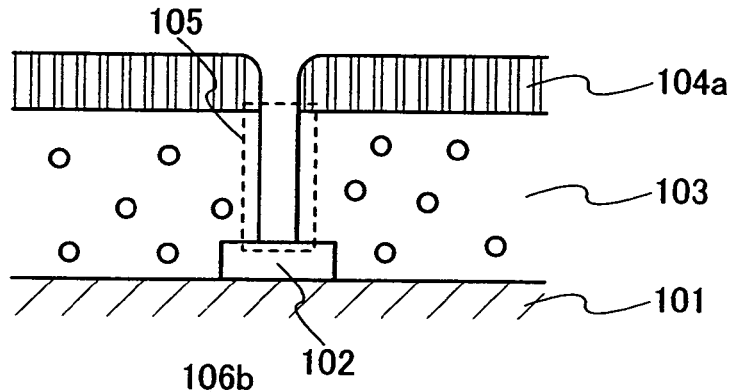

After forming the interlayer insulating film 103, patterning is conducted by photolithography to form a first mask 104a formed of a photoresist. Subsequently, the interlayer insulating film 103 is anisotropically etched to form a first opening (also referred to as a trench) 105 as shown in FIG. 1B.

Figure 1C:
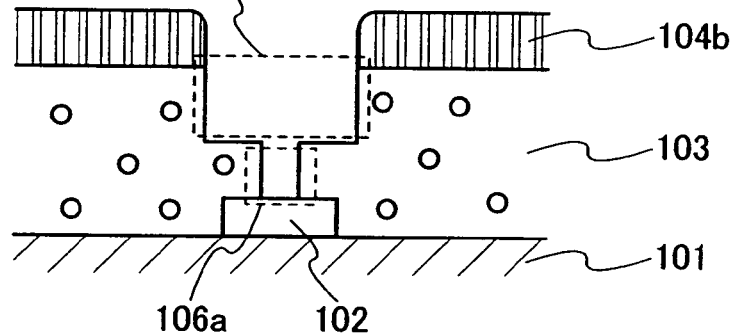

After removing the first mask 104a, patterning is conducted by photolithography to form another mask. Thus, as shown in FIG. 1C, a second mask 104b formed of a photoresist is formed. Subsequently, the interlayer insulating film 103 is anisotropically etched again to form a second opening including a connection hole 106a and a wiring trench 106b.

Figure 1D:
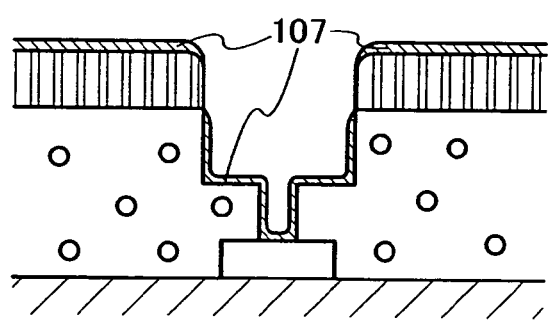

Thereafter, a barrier film 107 is formed over the entire surface by sputtering without removing the second mask 104b formed of a photoresist as shown in FIG. 1D. As shown in FIG. 1D, the inner walls of the connection hole 106a and the wiring trench 106b are also coated lightly with the barrier film 107; however, it is preferable that the inner wall of the thick second mask 104b is hardly coated therewith.

Here, a TiN film is used for the barrier film 107. Note that the barrier film 107 can be referred to as a first conductive film. The barrier film 107 is used as an antidiffusion film for suppressing defects such as leak which is caused by the diffusion of a wiring material to be later discharged by a droplet discharge method into the interlayer insulating film 103. Incidentally, the barrier film 107 can be deposited by CVD without limitation to the deposition by sputtering.

Figure 1E:
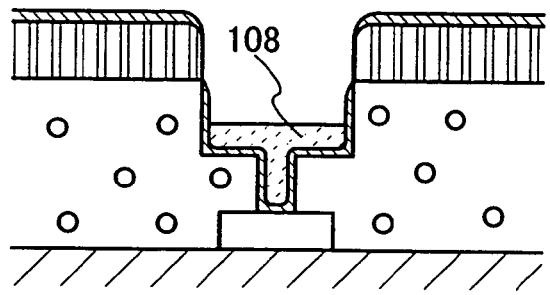

Next, as shown in FIG. 1E, an Ag containing paste 108 is dropped only into the opening by an ink-jet method. In an ink-jet method, when a discharged droplet reaches a substrate, the positional accuracy of the droplet is poor (for example, ±10 μm), so that the accuracy of the position to be applied with the droplet is complemented by using the second mask 104b formed of a photoresist as a partition wall in this embodiment mode. Hence, an ink-jet method can be used even in the case of a process rule of 10 μm or less.

Nanoparticles of Ag are included in the Ag containing paste 108 to be discharged by ink-jet, so that the resistance can be reduced compared with Cu which is used as a conventional wiring material. Further, since the paste is liquid, it can coat a base having any shape. Thus, a wiring can be formed irrespective of the shape of the base.

The size of the nanoparticles of Ag included in the Ag containing paste 108 is about 3 nm to 5 nm. Accordingly, in the case where the paste containing Ag is applied onto the interlayer insulating film 103 which is a porous insulating film or onto the barrier film 107 deposited over the interlayer insulating film 103, Ag particles penetrate into cavities or depressions of the interlayer insulating film 103, or depressions on the barrier film 107 deposited over the interlayer insulating film 103. Thus, the adhesion is increased by what is called an anchoring effect.

The Ag containing paste 108 can not have sufficient conductivity unless baking at about 300° C. is carried. Therefore, only the Ag containing paste 108 is selectively heated and baked using a laser apparatus. The reason for using the laser apparatus will be explained later.

Note that, in this embodiment mode, a formation which is made by baking the paste containing Ag is also referred to as an Ag containing paste 108. Actually, the formation is a conductor which has been solidified by being fused or welded and joined by baking, and it can be also referred to as a second conductive layer.

Figure 2A:
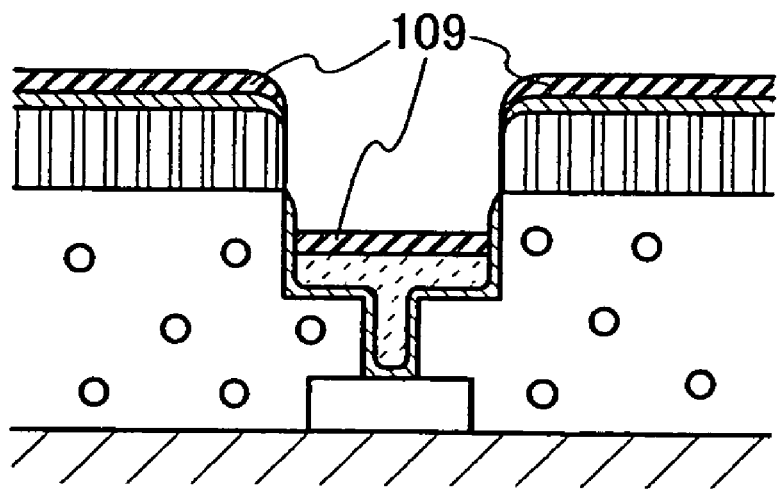
FIGS. 2A to 2C are figures showing a manufacturing process of the present invention (Embodiment Mode 1).

Next, as shown in FIG. 2A, a conductive film 109 is formed by sputtering so as to cover the entire surface of the Ag containing paste 108. As shown in FIG. 2A, it is preferable that the inner wall of the thick second mask is hardly coated therewith. Further, in FIG. 2A, the conductive film 109 is hardly formed on the inner walls of the connection hole 106a and the wiring trench 106b, but may be formed thereon. The conductive film 109 is used as a barrier for preventing device defects such as leak which is caused by the diffusion of the Ag containing paste 108 into the interlayer insulating film 103 after the Ag containing paste 108 is baked.

Further, there is a problem that the Ag containing paste 108 is corroded by an etching gas and the conductivity is reduced. The case of manufacturing a structure shown in FIG. 2C will be explained. In the structure, a connection hole 114 is formed in an interlayer insulating film 112 to connect an Ag containing paste 111 and an upper electrode 113. In forming the connection hole 114, if the interlayer insulating film 112 is etched by dry etching, the Ag containing paste 111 is corroded by the excited etching gas, and the conductivity is significantly reduced.

In order to prevent such corrosion, it is effective to use the conductive film 109 as a barrier as shown in FIG. 2A. Note that the conductive film 109 can be also referred to as a third conductive layer.

For the above reason, the conductive film 109 is preferably formed from a material at least having characteristics of low resistance, a barrier function of suppressing diffusion of the conductive Ag containing paste 108, and sufficiently high selectivity with a silicon-based interlayer insulating film in dry etching. For example, the conductive film 109 may be formed of a material of W, Mo, Ti, Cr, and Ta or a mixture thereof.

Figure 2B:
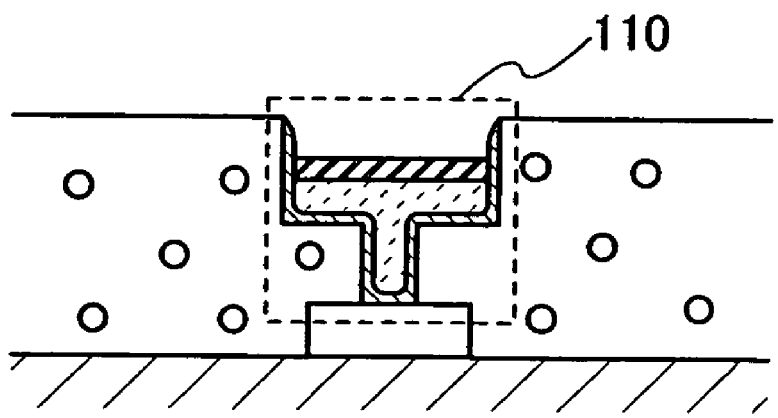
Figure 2C:
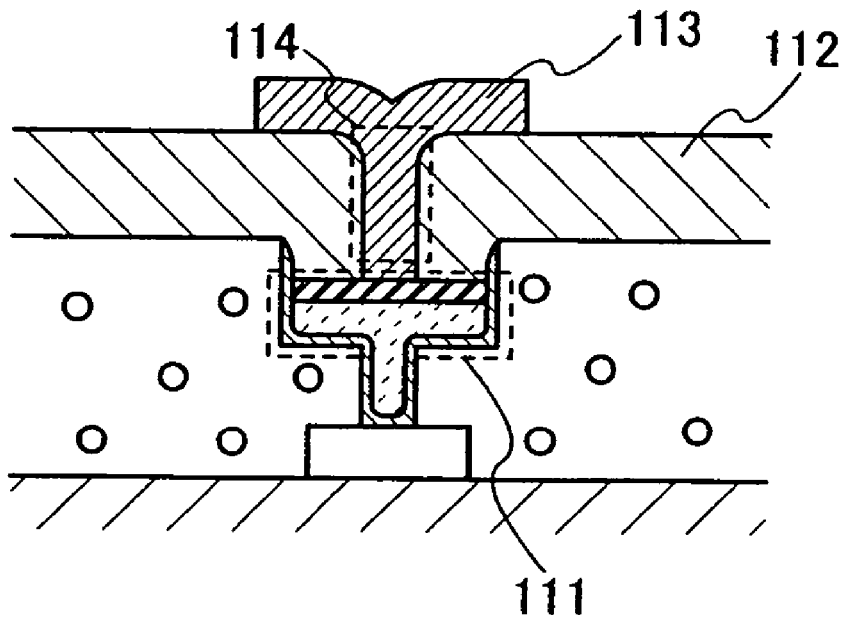

After the conductive film 109 is formed, the second mask 104b that functions as a photoresist is removed as shown in FIG. 2B. At that time, parts of the barrier film 107 and the conductive film 109 which are deposited over the second mask 104b formed of a photoresist are removed at the same time with the second mask 104b formed of a photoresist; thus, a wiring 110 embedded in the interlayer insulating film 103 can be formed. The embedded wiring 110 has a structure in which Ag is surrounded by the barrier film 107 and the conductive film 109.

Here, the reason for using a laser apparatus for baking the conductive Ag containing paste 108 as above will be explained. A method by which a deposit over a photo resist is removed together with the photo resist is called a lift-off method. In order to use this method, it is required that a photo resist can be separated from a substrate, the deposit on the photo resist is isolated form the deposit on the substrate. In a manufacturing process of the present invention, if a heating apparatus such as an oven is used, the substrate is entirely heated, and besides, the resist is also heated to several hundred ° C. Since a photo resist generally becomes difficult to be removed after being heated at a high temperature, the lift-off method cannot be used in that case. Therefore, in this embodiment mode, a laser apparatus is used to selectively bake the wiring, so that the lift-off method can be used after the wiring baking step.

Further, an example of using an insulating film 101 provided over a semiconductor substrate in which elements such as a transistor is formed is described here. However, an insulating film provided over a glass substrate may be used without limitation thereto. For example, a lower layer wiring may be formed over an interlayer insulating film of a TFT provided over a glass substrate and an embedded wiring connected to the lower layer wiring may be formed.

Embodiment Mode 2

In this embodiment mode, one mode of the present invention in which part of the process is different from the above Embodiment Mode 1 will be described with reference to FIGS. 3A to 3F. Here, semiconductor elements and integrated circuits are not shown for simplicity, and only a connection portion of an embedded silver wiring and a lower layer wiring is shown as in FIGS. 1A to 1F.

Figure 3A:
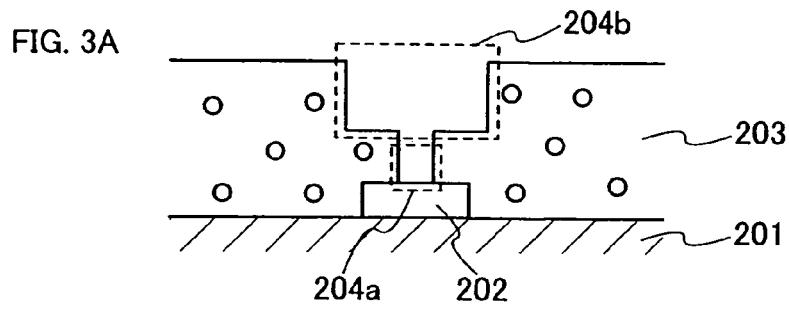
FIGS. 3A to 3F are figures showing a manufacturing process of the present invention (Embodiment Mode 2)

First, steps of from FIG. 1A to FIG. 1C are conducted as in Embodiment Mode 1. Subsequently, the mask is removed to obtain the state shown in FIG. 3A. FIG. 3A shows a lower layer wiring 202 and an interlayer insulating film 203 which are formed over an insulating film 201 provided over a semiconductor substrate in which elements such as a transistor (not shown) are formed, and a connection hole 204a and a wiring trench 204b which are provided in the interlayer insulating film 203.

Figure 3B:
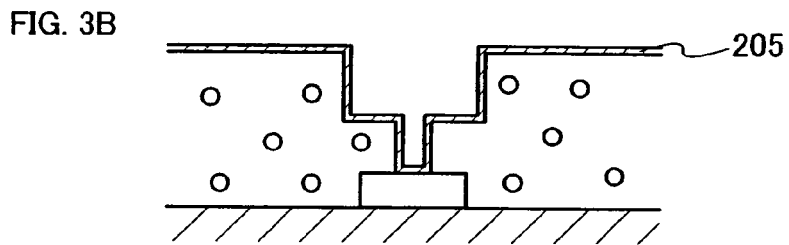

Next, a barrier film 205 is formed over the entire surface by sputtering or CVD as shown in FIG. 3B. The inner wall of the opening is also coated with the barrier film. Further, the barrier film 205 can be referred to as a first conductive layer.

The barrier film 205 is thereafter subjected to surface treatment by ultraviolet irradiation in order to improve the wettability of the droplet to be later dropped. Here, the surface treatment for improving wettability is performed so that the contact angle with the droplet is 10° or less. Other than ultra-violet irradiation, plasma treatment using a gas such as oxygen, argon, hydrogen, or helium, or corona discharge may be conducted as the treatment.

Figure 3C:
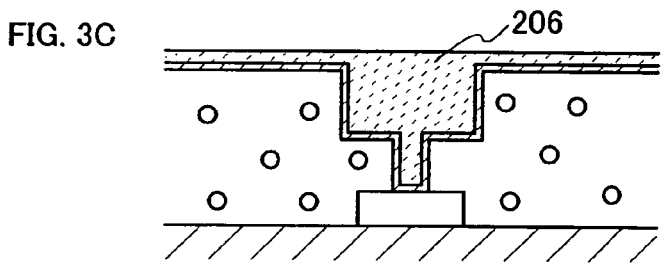

Subsequently, the connection hole 204a and the wiring trench 204b are filled with an Ag containing paste 206 using an ink-jet method as shown in FIG. 3C. Here, the Ag containing paste 206 wets and spreads by the above surface modification treatment. Part of the Ag containing paste 206 which overflows the connection hole 204a and the wiring trench 204b wets and spreads so as to fill openings such as a connection hole and a wiring trench (not shown) which are formed around the connection hole 204a and the wiring trench 204b.

As described above, the Ag containing paste 206 is dropped so as to wet and spread; thus, the tact time of a dropping process can be reduced compared with a method in which the dropping is conducted along the connection hole 204a and the wiring trench 204b by an ink-jet method. Further, the consumption of material can be reduced compared with a method in which coating is conducted by spin-on-coating.

Next, baking is conducted at 300° C. for one hour using a heating apparatus such as an oven. In this embodiment mode, a formation which is made by vaporizing a solvent contained in the Ag containing paste is also referred to as an Ag containing paste 206. Actually, the formation is a conductor which has been solidified by being fused or welded and joined by baking, and it can be also referred to as a second conductive layer.

Figure 3D:
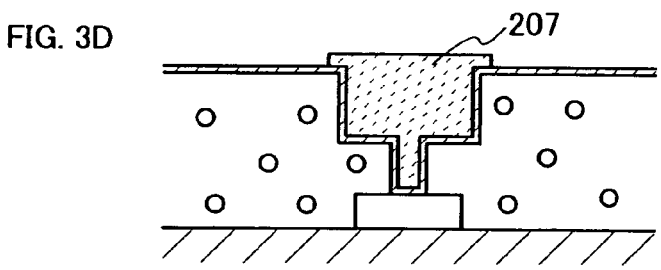

Patterning is thereafter conducted by photolithography and wet etching is conducted using a mixed acid solution of nitric acid and acetic acid to form an Ag wiring 207 as shown in FIG. 3D.

Figure 3E:
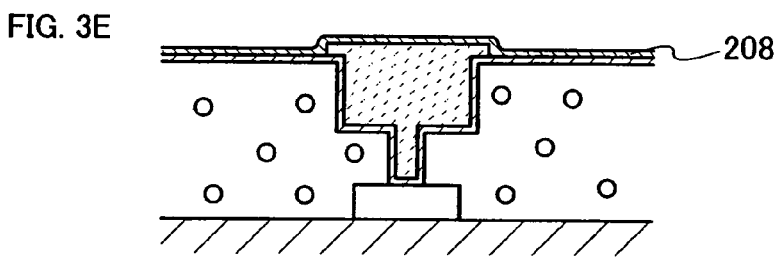

Subsequently, as shown in FIG. 3E, a conductive film 208 is formed by sputtering. Note that the conductive film 208 can be also referred to as a third conductive film.

Figure 3F:
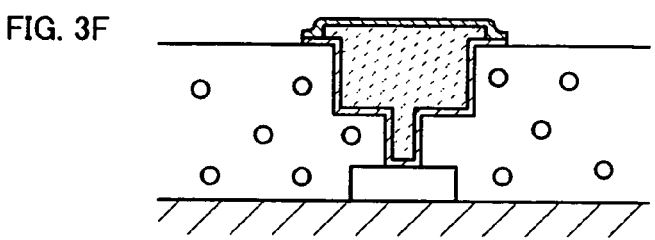

Next, as shown in FIG. 3F, the barrier film 205 and the conductive film 208 are etched by anisotropic etching. Thus, a wiring embedded in the interlayer insulating film 203 can be obtained. The embedded wiring has a structure in which Ag is surrounded by the barrier film 205 and the conductive film 208.

This embodiment mode can be freely combined with Embodiment Mode 1.

The present invention having the above structure will be explained in more details in the following Embodiments.

Embodiment 1

A procedure for manufacturing an FET using the present invention will be hereinafter described simply with reference to FIG. 4. Here, an example of using a wiring connected to an impurity region of the FET as a lower layer wiring to form an embedded wiring in a porous insulating film covering the lower layer wiring is shown.

A silicon substrate 301 formed of single crystal silicon is prepared. An n-well 302 is formed in a first element formation region in a main surface (also referred to as an element formation surface or a circuit formation surface) of the silicon substrate, and a p-well 303 is formed in a second element formation region in the same surface.

Next, a field oxide film 306 to be an element isolation region for partitioning the first element formation region and the second element formation region is formed. The field oxide film 306 is a thick thermal oxide film and may be formed by known LOCOS. Note that the element isolation method is not limited to the LOCOS. For example, the element isolation region may have a trench structure by using a trench isolation method, or the LOCOS and the trench structure may be combined.

Subsequently, a gate insulating film is formed by, for example, thermally oxidizing the surface of the silicon substrate. The gate insulating film can also be formed by CVD. A silicon oxynitride film, a silicon oxide film, a silicon nitride film, or a stack thereof may be used. For example, a stack film of a silicon oxide film with a thickness of 5 nm which is obtained by thermal oxidation and a silicon oxynitride film with a thickness of 10 nm to 15 nm which is obtained by CVD is formed.

A stack film of polysilicon layers 311a and 317a and silicide layers 311b and 317b are formed over the entire surface, and the stack film is patterned by lithography and dry etching so as to form gate electrodes 311 and 317 having a polycide structure over the gate insulating film. The polysilicon layers 311a and 317a may be doped with phosphorus (P) at about a concentration of $10^{21}/cm^3$ in advance in order to reduce the resistance. Alternatively, high concentration n-type impurities may be diffused after forming the polysilicon layers 311a and 317a. Further, the silicide layers 311b and 317b can be formed of a material such as molybdenum silicide (MoSix), tungsten silicide (WSix), tantalum siliside (TaSix), or titanium silicide (TiSix) using a known method.

Subsequently, an ion implantation is conducted into the silicon semiconductor substrate through the gate insulating film to form an extension region. In this embodiment, each impurity region formed between a channel formation region and either a source region or a drain region is referred to as an extension region. The impurity concentration in the extension regions 307 and 313 may be lower or higher than, or the same as the impurity concentration in the source region and the drain region. Accordingly, the impurity region of the extension region may be determined depending on the characteristics required for a semiconductor device.

Since this embodiment describes the case of manufacturing a CMOS, the first element formation region for forming a p-channel FET is coated with a resist material, and arsenic (As) or phosphorus (P) which is an n-type impurity is injected into the silicon substrate using the gate electrode 317 as a mask. Further, the second element formation region for forming an n-channel FET is coated with a resist material, and boron (B) which is a p-type impurity is injected into the silicon substrate using the gate electrode 311 as a mask.

Subsequently, a first activation treatment is conducted in order to activate the implanted impurities and to reduce crystal defects in the silicon substrate, which is generated by the ion implantation.

Sidewalls 312 and 318 are formed on the side walls of the gate electrodes. For example, an insulating material layer formed of silicon oxide may be deposited over the entire surface by CVD and the insulating material layer may be etched back to form the sidewalls. By forming the sidewalls, step coverage of an insulating film 331 can be improved, and the sidewalls can be used as masks when an impurity region is formed. In the etch back, the gate insulating film may be selectively removed in a self-aligned manner. Alternatively, the gate insulating film may be etched after the etch back. Thus, the gate insulating films 310 and 316 having the total width of the gate electrodes and the sidewalls provided on the either side of the gate electrodes are formed. The structure obtained by selectively removing the gate insulating film makes it easy to form a contact hole, and can improve adhesiveness of an insulating film since the surface area of a source or a drain region to be in contact with the insulating film 331 is increased.

Next, an ion implantation is conducted into the exposed silicon substrate to form a source region and a drain region. Since this is the case of manufacturing a CMOS, the first element formation region for forming a p-channel FET is coated with a resist material, and arsenic (As) or phosphorus (P) which is an n-type impurity is injected into the silicon substrate to form a source region 314 and a drain region 315 using the gate electrode 317 and side walls 318 as masks. Further, the second element formation region for forming an n-channel FET is coated with a resist material, and boron (B) which is a p-type impurity is injected into the silicon substrate to form a source region 308 and a drain region 309 using the gate electrode 311 and side walls 312 as masks.

A second activation treatment is thereafter conducted in order to activate the implanted impurities and to reduce crystal defects in the silicon substrate, which is generated by the ion implantation.

After the activation, an interlayer insulating film, a plug electrode, a metal wiring, and the like are formed. The first interlayer insulating film 311 is formed to a thickness of 100 nm to 2000 nm with a silicon oxide film, a silicon oxynitride film, or the like by plasma CVD or low pressure CVD. Further, a second interlayer insulating film 332 formed of phosphosilicate glass (PSG), borosilicate glass (BSG), or phosphoborosilicate glass (PBSG) is formed thereover. The second interlayer insulating film 332 is manufactured by spin coating or normal pressure CVD to increase planarity.

Source electrodes 333 and 335, and drain electrodes 334 and 336 are formed after forming contact holes reaching the source regions and the drain regions of the respective FETs in the first interlayer insulating film 331 and the second interlayer insulating film 332, and aluminum (Al) which is commonly used as a low resistance material may preferably used. Further, the electrodes may have a layered structure of Al and titanium (Ti).

Although not shown here, a contact hole reaching a gate electrode is provided in the first interlayer insulating film 331 and the second interlayer insulating film 332, and an electrode electrically connecting to a wiring provided over the second interlayer insulating film is formed over the part of the first interlayer insulating film exposed in the opening.

Subsequently, a porous insulating film 342 to be a third interlayer insulating film is formed. The porous insulating film 342 is an insulating film in which minute cavities isolated from each other are uniformly distributed, and it can be obtained by CVD including plasma reaction or spin coating.

Next, etching using a mask is conducted in accordance with the method for forming an embedded wiring described in Embodiment Mode 1 to form connection holes and wiring trenches reaching the source electrodes 333 and 335.

Subsequently, a barrier film to be a first conductive layer 350 is formed, and an Ag containing paste is discharged by an ink-jet method. Ag containing paste is baked by selective irradiation with laser light to form a second conductive layer 351. A third conductive layer 352 is formed to cover the top surface of the second conductive layer 351. The mask together with the barrier film and the third conductive layer provided thereover is removed to form an embedded wiring. Thus formed embedded wiring has a stepped portion formed between the top surface of the third conductive layer 352 and the top surface of the porous insulating film 342. Further, a first conductive layer 350 that is protruded more than the third conductive layer 352 at the stepped portion is provided.

Subsequently, a fourth interlayer insulating film 343 is formed. The fourth interlayer insulating film 343 is formed to a thickness of 1 µm to 2 µm with an organic resin material. As the organic resin material, polyimide, polyamide, acrylic, benzocyclobutene (BCB), or the like can be used. It is advantageous to use an organic resin film since a method for forming a film is simple, the parasitic capacitance can be reduced due to low dielectric constant, it is suitable for planarization, and the like. Naturally, an organic resin film other than the one mentioned above may also be used.

Next, a contact hole reaching the conductive layer 352 is formed, a conductive film is deposited by sputtering, and the electrode 353 is formed by patterning.

Figure 4:
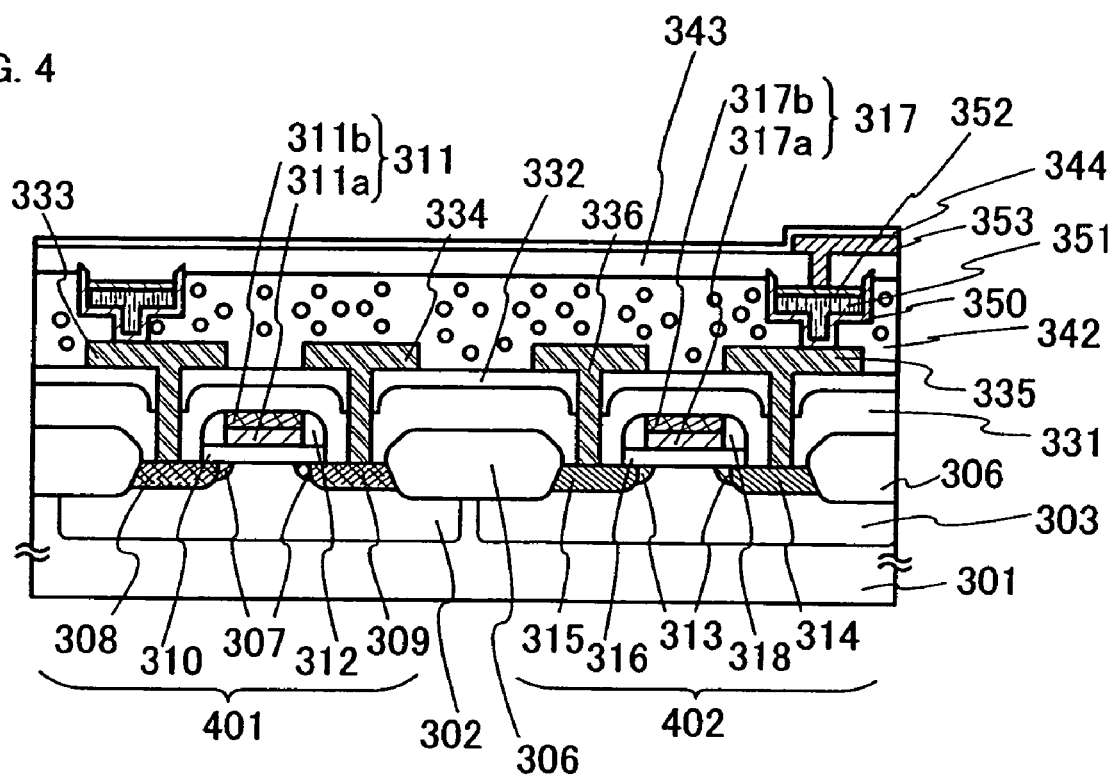
FIG. 4 is a cross-sectional view showing a manufacturing process of an FET of the present invention.

Finally, a passivation film 344 is formed so as to cover the electrode 353 to obtain a state shown in FIG. 4. In FIG. 4, a p-channel FET 401 is on the left side, and an n-channel transistor is on the right side. A CMOS circuit can be formed by complementarily combining those FETs.

A CMOS circuit can constitute part of an inverter circuit, a NAND circuit, an AND circuit, a NOR circuit, an OR circuit, a shift register circuit, a sampling circuit, a D/A converter circuit, an A/D converter circuit, a latch circuit, or a buffer circuit. In addition, a memory element such as an SRAM or a DRAM, a CPU, a controller circuit, or other integrated circuits can be formed by combining such CMOS circuits.

Further, the passivation film 344 is formed of a silicon nitride film, a silicon oxide film, or a silicon nitride oxide film by plasma CVD.

A top-gate type is shown as an example of an FET in this embodiment; however, the structure of an FET is not limited thereto, and it may be a staggered FET, for example.

In accordance with the invention, it is possible to realize a structure in which silver having lower resistivity than copper is used for a wiring material, and a porous insulating film having low dielectric constant is used as a material for an insulating film in which a wiring opening is formed. Accordingly, a high performance semiconductor device capable of high speed operation can be obtained.

Further, according to the present invention, the manufacturing cost spent for forming a wiring can be reduced by forming an embedded wiring without carrying out electroplating or CMP.

Note that an example of reducing resistivity by using an embedded wiring for part of a multilayer wiring is shown in this embodiment; however, embedded wirings may be provided in more layers.

This embodiment can be freely combined with Embodiment Mode 1 or Embodiment Mode 2.

Embodiment 2

A plurality of integrated circuits each having an FET described in Embodiment 1 is formed over a semiconductor substrate. Each of the integrated circuits is individually separated to form IC chips. Dicing is carried out to separate the chips individually. Subsequently, the chips are obtained from a wafer one by one to be mounted on a lead frame. Thereafter, an electrode terminal of a chip and an inner lead of a lead frame are connected with each other using a gold wire having a diameter of 20 µm to 30 µm for electrical connection. Next, sealing is carried out using a mold resin layer so as to make the handling easy. Subsequently, the lead is solder plated to prevent rust. Thereafter, the chips are separated from the lead frame into individual packages. In this manner, packaging is performed.

Figure 5:
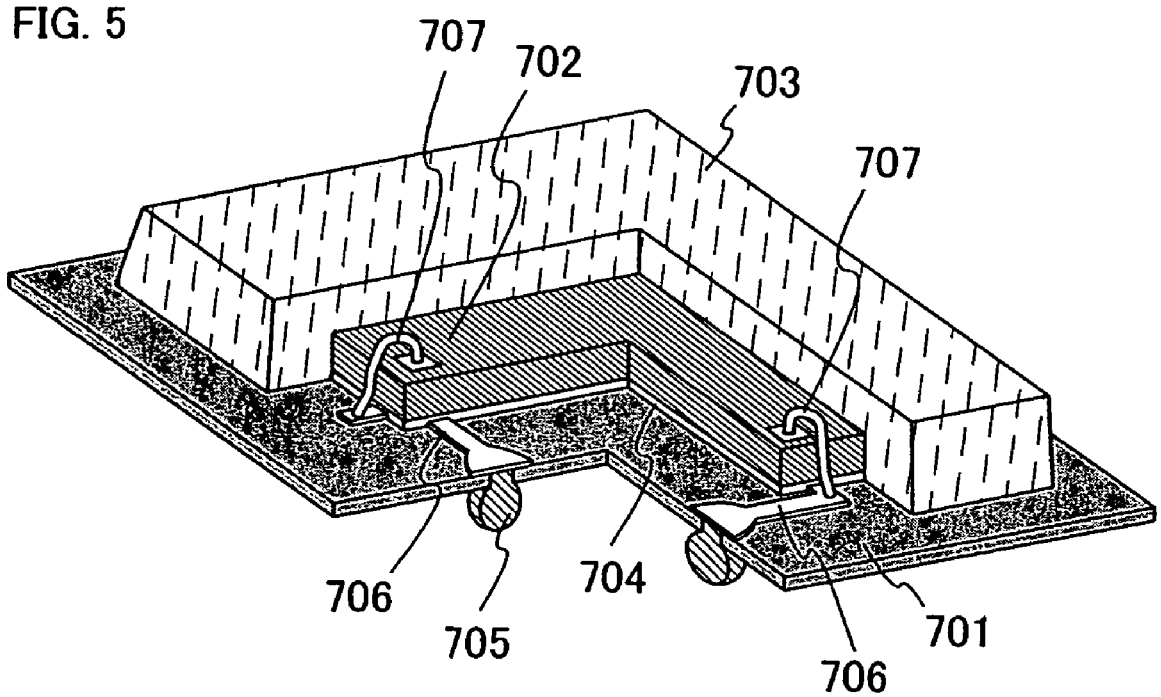
FIG. 5 is a perspective view showing a cross-sectional structure of a packaged device.

FIG. 5 shows a perspective view showing a cross-sectional structure of a device which has been packed. In the structure shown in FIG. 5, a chip 702 is connected with a lead frame 701 by wire bonding. The chip 702 is sealed with a mold resin layer 703. Further, the chip 702 is mounted over the lead frame 701 with an adhesive for mounting.

The lead frame 701 is a ball-grid-array type provided with a solder ball 705. The solder ball 705 is provided on the opposite side of the lead frame 701 provided with the chip 702. A wiring 706 provided on the lead frame 701 is electrically connected to the solder ball 705 via a contact hole provided in the lead frame.

Note that, in this embodiment, the wiring 706 for eclectically connecting the chip 702 and the solder ball 705 is mounted over a surface of the lead frame 701 mounted with the chip. However, the lead frame is not limited thereto. For example, multilayer wirings may be provided inside the lead frame.

In FIG. 4, the chip 702 and the wire 706 are electrically connected using a gold wire 707. The chip 702 is provided with a semiconductor element, and a pad is provide on the opposite side of the chip 702 provided with the lead frame 701. The pad is electrically connected with the semiconductor element. The pad is connected to the wiring 706 provided over the lead frame 701 using the gold wire 707.

This embodiment can be freely combined with Embodiment Mode 1, Embodiment Mode 2, or Embodiment 1.

Embodiment 3

Various kinds of electronic devices can be completed with an IC chip in which an integrated circuit using an embedded wiring of the present invention is fabricated. Further, an FET is used as a switching element, and a reflective active matrix substrate using a reflector electrode connected to the switching element is used to constitute a display area of an electronic device. Various kinds of electronic devices can be completed.

For example, various kinds of electronic devices can be completed with a display area using an FET as a switching element and using an active matrix liquid crystal display device provided with a liquid crystal element including a pixel electrode connected to the switching element, a liquid crystal layer, and a counter electrode.

For example, various kinds of electronic devices can be completed with a display area using an FET as a switching element and using an active matrix light emitting device provided with a stack of a first electrode connected to the switching element, a layer containing an organic compound, and a second electrode.

As such electronic devices, a personal computer, a game machine, a portable information terminal (such as a mobile computer, a cellular phone, a portable game machine, or an electronic book), a camera such as a video camera or a digital camera, a reflective projector, a navigation system, an audio reproduction device (such as a car audio system, audio components), an image reproduction device provided with a memory medium (specifically, a device equipped with a display and an IC chip by which the content of a memory medium such as a digital versatile disc (DVD) can be reproduced and the image can be displayed), and the like can be completed.

Figure 6A:
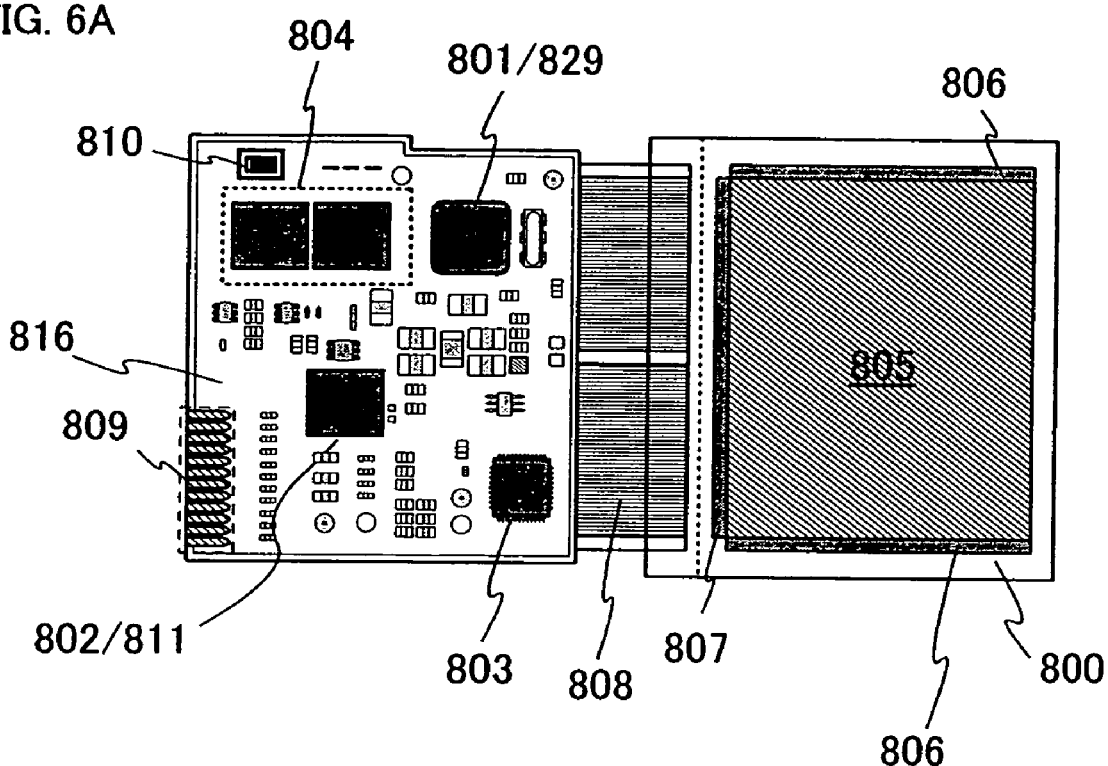
FIGS. 6A and 6B are top views showing examples of applying the invention to a panel module.

A cellular phone which is one of electric devices in the present invention is taken as an example. FIG. 6A shows how the electric device is practically equipped with a package.

A module of the cellular phone shown in FIG. 6A includes a printed wiring board 816 mounted with CPUs 811 and 802 stacked over a memory, a power supply circuit 803, a controller 801 provided over a sound processing circuit 829, a transmitter-receiver circuit 804, and other elements such as a resistor, a buffer, and a capacitor. Moreover, a panel 800 is mounted over the printed wiring board 816 using an FPC 808. The panel 800 is provided with a pixel area 805, a scan line driver circuit 806 for selecting a pixel included in the pixel area 805, a signal line driver circuit 807 for supplying a video signal to the selected pixel.

Supply voltage to the printed wiring board 816 and various signals inputted with a key board are supplied through an interface portion 809 of the printed wiring board in which plural input terminals are disposed. Further, an antenna port 810 which transmits and receives signals between the printed wiring board and an antenna is provided over the printed wiring board 816.

In the present embodiment mode, the printed wiring board 816 is mounted on the panel 800 by using an FPC. The structure is not limited thereto. A controller 801, a sound processing circuit 829, a memory 811, a CPU 802, or a power supply circuit 803 may be directly mounted on the panel 800 with a COG (Chip on Glass) method.

Further, in the printed wiring board 816, there is a case that capacitance formed between leading wirings and resistance of a wiring itself cause noise to a supply voltage or a signal, or make a rise of a signal dull. Correspondingly, various kinds of elements such as a capacitor element and a buffer are provided over the printed wiring board 816, thereby preventing the noise to the supply voltage or the signal and the dull rise of the signal in the printed wiring board 816.

Figure 6B:
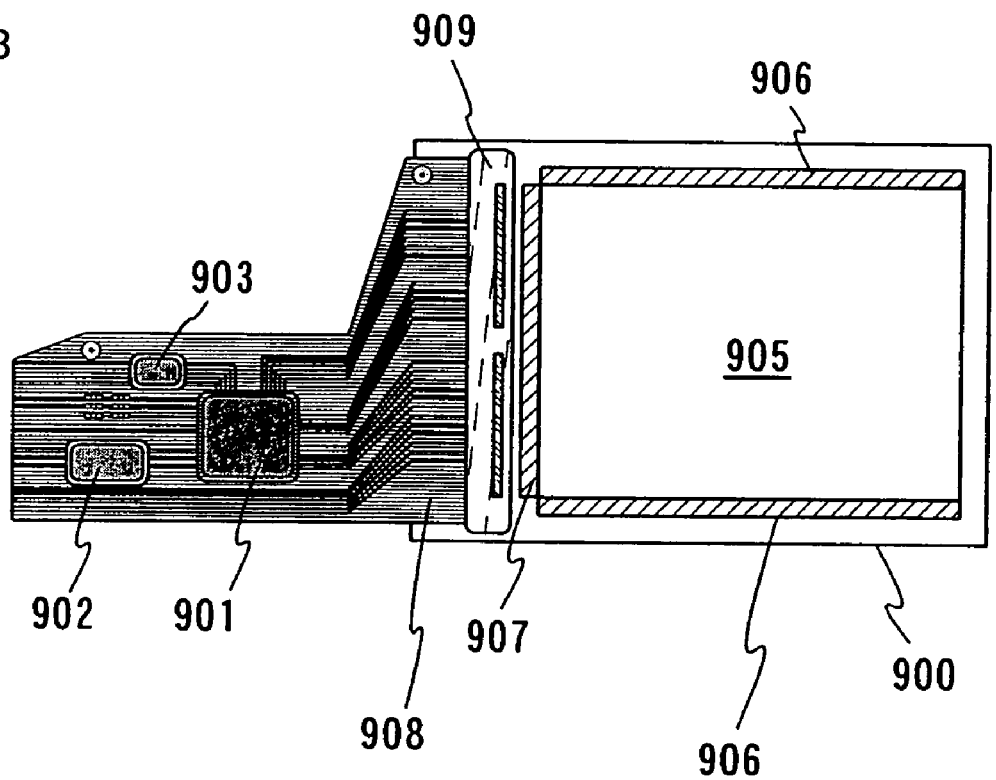

Further, FIG. 6B shows an example of a module equipped with an integrated circuit provided over an FPC.

As shown in FIG. 6B, an integrated circuit (a controller 901, a CPU (central processing unit) 902, and a memory 903) is mounted over an FPC 908. A panel 900 is provided with a pixel area 905 and a driver circuit (a signal line driver circuit 907 and a scan line driver circuit 906), and an FPC 908 for connecting them to an external power or the like (not shown) which is provided outside is attached to the panel 900 with an adhesive 909. The integrated circuit (the controller 901, CPU 902, and memory 903) using a semiconductor substrate is mounted over the FPC 908; thus, the noise in the supply voltage or the signal and the dull rise of the signal are prevented.

Further, this embodiment can be freely combined with Embodiment Mode 1, Embodiment Mode 2, Embodiment 1, or Embodiment 2.

Embodiment 4

An IC chip in which an integrated circuit using an embedded wiring of the present invention is fabricated can be used as a noncontact thin film integrated circuit device (also referred to as a wireless IC tag or RFID (radio frequency identification)).

Figure 7:
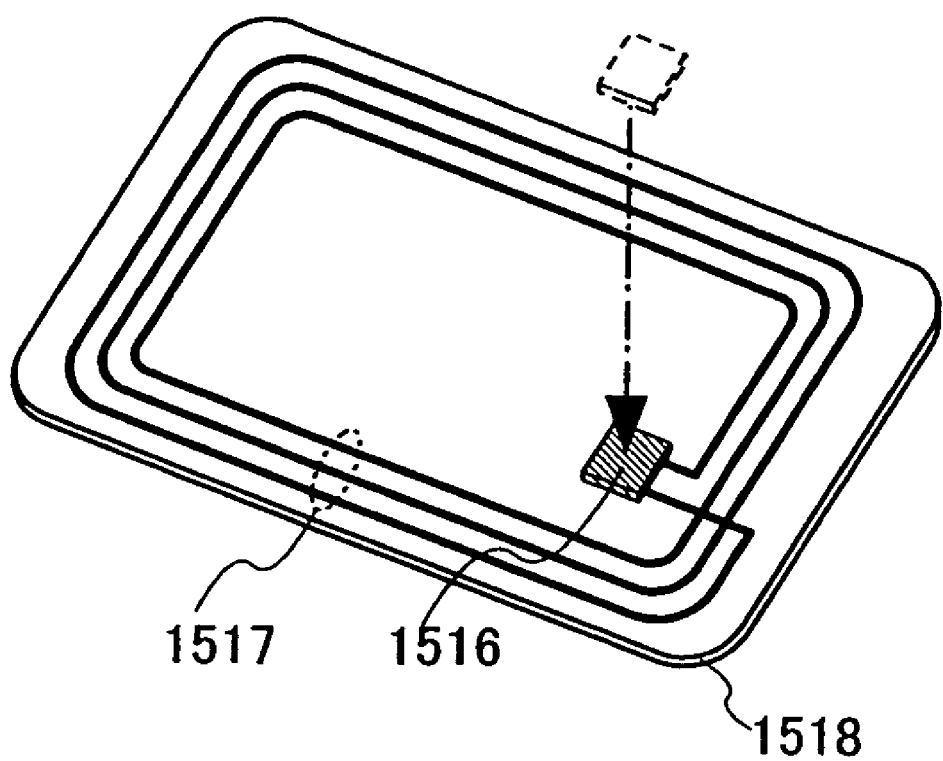
FIG. 7 is a top view showing an example of applying the invention to a card.

An example of an ID card in which an IC chip 1516 according to the present invention is attached to a card-like substrate 1518 provided with a conductive layer 1517 which serves as an antenna is shown in FIG. 7. Thus, the IC chip 1516 according to the present invention is small, thin, and lightweight, so that diverse uses can be realized and it does not spoil the design of an article even when it is attached to the article.

An IC chip 1516 according to the invention is not limited to the case of being attached to a card-like substrate 1518, and it can be attached to an article having a curved surface, or various shapes. For example, the IC chips can be used in paper money, coin, securities, bearer bonds, a certificate (such as a driver's license, a resident's card, a packing case (such as a wrapper or a bottle), a memory medium (such as a DVD, a video tape), a vehicle (such as a bicycle), belongings (such as a bag, glasses), food, clothing, commodities, or the like.

This embodiment can be freely combined with Embodiment Mode 1, Embodiment Mode 2, Embodiment 1, Embodiment 2, or Embodiment 3.

Embodiment 5

An IC chip in which an integrated circuit using an embedded wiring of the present invention is fabricated can be mounted to complete various electronic devise. The specific examples are shown in FIGS. 8A to 8E.

Figure 8A:
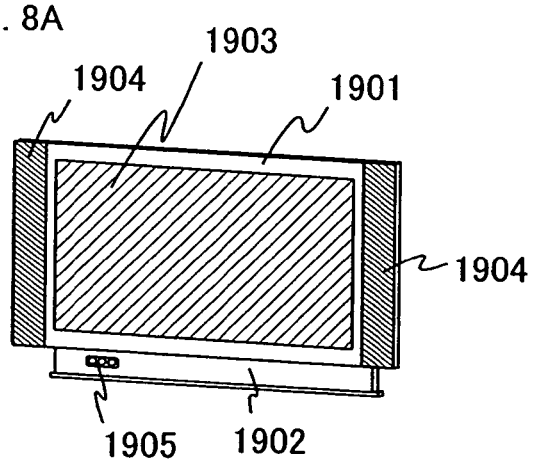
FIGS. 8A to 8E are figures showing examples of electronic devices.

FIG. 8A shows a display device including a casing 1901, a support 1902, a display area 1903, speaker portions 1904, a video input terminal 1905, and the like. The display device is manufactured using an FET formed by the manufacturing method shown in embodiment modes and other embodiments to its driver integrated circuit. The display device includes a liquid crystal display device, a light emitting device, and the like, and it includes all display devices for information display, for example, ones for a computer, a TV receiving, and an advertising display.

Figure 8B:
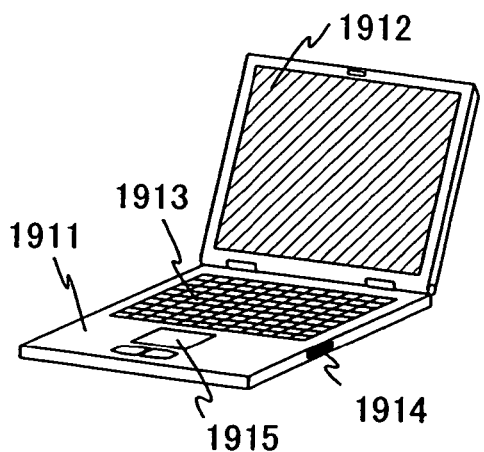

FIG. 8B shows a personal computer including a casing 1911, a display area 1912, a keyboard 1913, an external connection port 1914, a pointing mouse 1915, and the like. By using the manufacturing method shown in the above mentioned embodiment modes and other embodiments, it can be applied to the driver IC of the display area 1912, a CPU or a memory inside the main body, and the like.

Figure 8C:
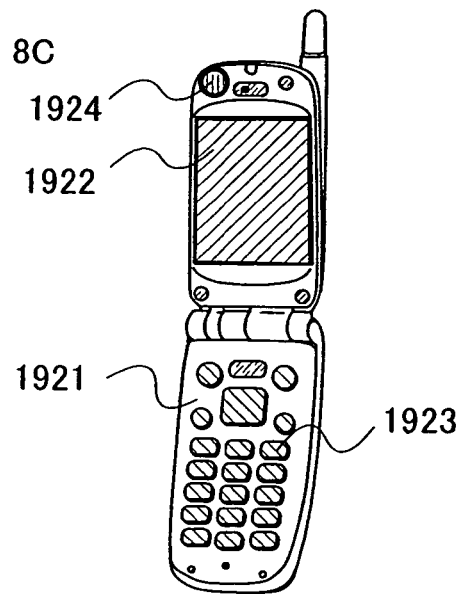

FIG. 8C shows a cellular phone which is a typical example of a portable information terminal. The cellular phone includes a casing 1921, a display area 1922, a sensor portion 1924, operation keys 1923, and the like. The sensor portion 1924 has an optical sensor element, and the amount of consumption current of the cellular phone can be suppressed by controlling the brightness of the display area 1922 based on the ambient light level obtained in the sensor portion 1924, or conducting the lighting control of the operation keys 1923 corresponding to the ambient light level obtained by the sensor portion 1924. In addition, in the case of a cellular phone having an imaging function such as a CCD or the like, whether a person who takes a picture looks into an optical finder or not is detected when the amount of light received by a sensor of the sensor portion 1924 provided in the vicinity of the optical finder changes. In the case where a person who takes a picture looks into the optical finder, the amount of electric power consumption can be suppressed by turning the display area 1922 off.

The display screen of electronic devices typified by the above mentioned mobile phone, a PDA (Personal Digital Assistants), a digital camera, a compact game machine or the like, has a small display area, because each of electronic devices is a mobile information terminal. Therefore, by forming functional circuits such as a CPU, a memory, a sensor using an FET shown in the above mentioned embodiment mode, the functional circuits can be made smaller and lighter.

Figure 8D:
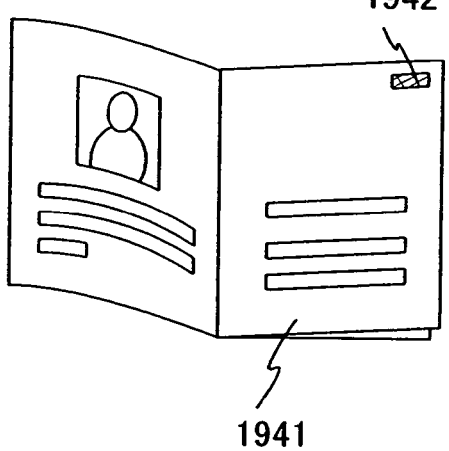

Moreover, a distribution route and the like of the electronic devices can be revealed by attaching an IC tag to various electronic devices. FIG. 8D shows a state where a radio frequency IC tag 1942 is attached to a passport 1941. The radio frequency IC tag may be embedded in the passport 1941. In the same manner, the radio frequency IC tag can be attached to or embedded in a driver's license, a credit card, paper money, coin, securities, a gift coupon, a ticket, a traveler's check (T/C), a health insurance, a resident's card, a family register, and the like. In this case, only the information showing the real one is inputted into the radio frequency IC tag and an access right is set to prevent unauthorized reading or writing of information. That can be realized by using a memory shown in other embodiment modes and embodiments. By using the IC chip as a tag, in this manner, it is possible to distinguish a counterfeit from the real one.

Figure 8E:
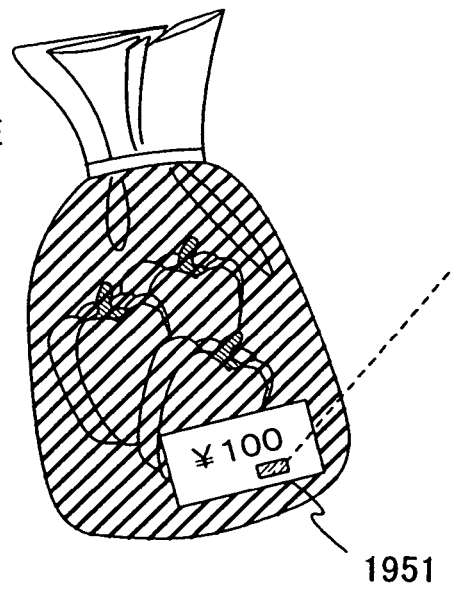
Figure 8E:
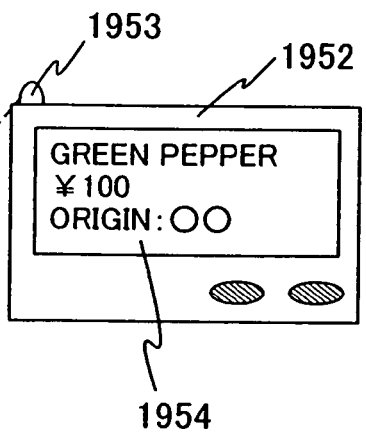

In addition to the above, the radio frequency IC tag can also be used as a memory. FIG. 8E shows an example in which a radio frequency IC tag 1951 is used for a label attached to a vegetable wrapping. In addition, the radio frequency IC tag may be attached to or embedded in the wrapping itself. The radio frequency IC tag 1951 can store process of commodity circulation, price, numerical quantity, use, shape, weight, an expire date, various identification information, and/or the like, and stages of a production process such as place of production, producer, date of manufacture, processing method. The information from the radio frequency IC tag 1951 is received and read by an antenna portion 1953 of a reader 1952, and displaying on a display area 1954 of the reader 1952. Thus, the information can be easily known to dealers, retailers, and consumers. The system is that access rights of a producer, a trader, and a consumer are respectively set, and reading, writing, and erasing cannot be conducted without the rights.

Further, the radio frequency IC tag can be used as below. In stores, the information that a payment has been made is written in the radio frequency IC tag, and whether the payment has been made or not is checked at a provided checking device at an exit. If people leave the stores without payments, an alarm rings. By this method, forgetting about paying or shoplifting can be prevented.

In considering the protection of customer privacy, the following methods are possible. Whichever of the methods is employed when the payment is made: (1) the data inputted in the radio frequency IC tag is locked with a code number; (2) the data itself inputted in the radio frequency IC tag is encrypted; (3) the data inputted in the radio frequency IC tag is erased; or (4) the data inputted in the radio frequency IC tag is destroyed. These methods can be realized by using a memory shown in the above described embodiment modes. A checking means is provided at an exit, and whether or not any of the processes (1) to (4) is conducted, or whether nothing is written in the data in the radio frequency IC tag is checked, thereby checking whether payment has been made. In this manner, it is possible to check whether payment has been made in stores, and the information in the radio frequency IC tag is prevented from being read without the owner's will outside of stores.

By using the present invention, it is possible to realize a structure in which silver having lower resistivity than copper is used as a wiring material, and a porous insulating film having low dielectric constant is used as a material for an insulating film in which a wiring opening is formed. Thus, miniaturization of an IC chip provided in a wireless IC tag can be realized. Since the impact strength of an IC chip is increased as the size thereof is smaller, the reliability is increased. Further, an embedded wiring of the present invention is formed without electroplating or CMP; thus, the cost spent for manufacturing a wireless tag can be reduced.

As mentioned above, the application range of a semiconductor device manufactured by the present invention is extremely wide, and a semiconductor device manufactured by the present invention can be used for electronic devices in various fields.

In addition, this embodiment can be freely combined with Embodiment Mode 1, Embodiment Mode 2, Embodiment 1, Embodiment 2, Embodiment 3, or Embodiment 4.

By applying the present invention to the formation of a multilevel interconnection of a semiconductor device, miniaturization of the multilayer wiring and increase in the layers can be further promoted, so that further integration of a semiconductor device can be aimed.

Further, in accordance with the present invention, an embedded wiring can be formed without electroplating or CMP; thus, the manufacturing cost of a semiconductor device can be reduced.

What is claimed is:

1. A semiconductor device comprising:
   a wiring layer; and
   a porous insulating film having a wiring trench and a contact hole connected to said wiring trench,
   wherein the wiring layer comprises:
      a first conductive layer in contact with a bottom and an inner wall of each of the wiring trench and the contact hole formed in the porous insulating film,
      a second conductive layer on the first conductive layer, and
      a third conductive layer in contact with the first conductive layer and a top surface of the second conductive layer,
   wherein a first surface including a top surface of the porous insulating film and a second surface including a top surface of the third conductive layer have a stepped portion therebetween, and
   wherein the first surface including the top surface of the porous insulating film and a third surface including the top surface of the second conductive layer have a stepped portion therebetween.

2. A semiconductor device according to claim 1,
   wherein the porous insulating film is formed of a material comprising silicon oxide.

3. A semiconductor device according to claim 1,
   wherein the first conductive layer is formed of a metal material containing one or more selected from the group consisting of W, Mo, Ti, Cr, and Ta.

4. A semiconductor device according to claim 1,
   wherein the third conductive layer is formed of a metal material containing one or more selected from the group consisting of W, Mo, Ti, Cr, and Ta.

5. A semiconductor device according to claim 1,
wherein the second conductive layer is formed of a material containing silver.

6. A semiconductor device according to claim 1,
wherein the second conductive layer is formed of a material containing resin.

7. A semiconductor device according to claim 1,
wherein the semiconductor device includes at least one of a controller, a CPU, and a memory.

8. A semiconductor device according to claim 1,
wherein said semiconductor device has a multilevel interconnection, and said wiring layer is included in said multilevel interconnection.

9. A semiconductor device according to claim 1,
wherein the wiring layer is formed over a semiconductor substrate.

10. A semiconductor device according to claim 1, wherein the first conductive layer and the third conductive layer are in direct contact with each other.

11. A semiconductor device comprising:
a wiring layer; and
an insulating film having a wiring trench and a contact hole connected to said wiring trench,
wherein the wiring layer comprises:
a first conductive layer in contact with a bottom and an inner wall of each of the wiring trench and the contact hole formed in the insulating film,
a second conductive layer on the first conductive layer, and
a third conductive layer in contact with the first conductive layer and a top surface of the second conductive layer,
wherein a first surface including a top surface of the insulating film and a second surface including a top surface of the third conductive layer have a stepped portion therebetween, and
wherein the first surface including the top surface of the insulating film and a third surface including the top surface of the second conductive layer have a stepped portion therebetween.

12. A semiconductor device according to claim 11,
wherein the first conductive layer is formed of a metal material containing one or more selected from the group consisting of W, Mo, Ti, Cr, and Ta.

13. A semiconductor device according to claim 11,
wherein the third conductive layer is formed of a metal material containing one or more selected from the group consisting of W, Mo, Ti, Cr, and Ta.

14. A semiconductor device according to claim 11,
wherein the second conductive layer is formed of a material containing silver.

15. A semiconductor device according to claim 11,
wherein the second conductive layer is formed of a material containing resin.

16. A semiconductor device according to claim 11,
wherein the semiconductor device includes at least one of a controller, a CPU, and a memory.

17. A semiconductor device according to claim 11,
wherein said semiconductor device has a multilevel interconnection, and said wiring layer is included in said multilevel interconnection.

18. A semiconductor device according to claim 11,
wherein the wiring layer is formed over a semiconductor substrate.

19. A semiconductor device according to claim 11, wherein the first conductive layer and the third conductive layer are in direct contact with each other.

* * * * *